(12) United States Patent
Pascucci

(10) Patent No.: US 6,930,927 B2
(45) Date of Patent: Aug. 16, 2005

(54) LINE SELECTOR FOR A MATRIX OF MEMORY ELEMENTS

(75) Inventor: Luigi Pascucci, Sesto San Giovanni (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/616,414

(22) Filed: Jul. 8, 2003

(65) Prior Publication Data

US 2004/0062132 A1 Apr. 1, 2004

(30) Foreign Application Priority Data

Jul. 10, 2002 (EP) ............................................. 02425453

(51) Int. Cl.$^7$ .............................................. G11C 16/04
(52) U.S. Cl. .............................. 365/185.29; 365/185.11; 365/185.19; 365/185.23
(58) Field of Search ....................... 365/185.29, 185.11, 365/185.19, 185.23

(56) References Cited

U.S. PATENT DOCUMENTS

| | | | | |
|---|---|---|---|---|
| 5,361,237 A | * | 11/1994 | Chishiki | 365/230.06 |
| 5,852,583 A | * | 12/1998 | Taito et al. | 365/230.06 |
| 5,901,089 A | * | 5/1999 | Korsh et al. | 365/185.24 |
| 5,923,609 A | * | 7/1999 | Roscher et al. | 365/230.06 |
| 5,963,477 A | | 10/1999 | Hung | |
| 5,978,275 A | | 11/1999 | Song et al. | |
| 6,222,779 B1 | | 4/2001 | Hara et al. | |
| 6,331,951 B1 | * | 12/2001 | Bautista et al. | 365/185.22 |

FOREIGN PATENT DOCUMENTS

EP 02425453 11/2002

OTHER PUBLICATIONS

PCT/US95/00077(WO9621227A Jul. 11, 1996.

* cited by examiner

*Primary Examiner*—Hoai Ho
(74) *Attorney, Agent, or Firm*—Lisa K. Jorgenson; Bryan A. Santarelli; Graybeal Jackson Haley LLP (57) ABSTRACT

A line selector for a matrix of memory elements, for example a word line selector, comprises a plurality of line group selection circuits, each one allowing the selection of a respective group of matrix lines according to an address; each matrix line group includes at least one matrix line. Flag means are associated with each line group, that can be set to declare a pending status of a prescribed operation, for example an erase operation, for the respective matrix line group. Means are provided for entrusting the flag means with the selection of the respective line group during the execution of the prescribed operation, in alternative to the respective line group selection circuit. The flag means enable, when set, the execution of the prescribed operation on the respective matrix line group.

29 Claims, 5 Drawing Sheets

FIG. 4

LINE SELECTOR FOR A MATRIX OF MEMORY ELEMENTS

PRIORITY CLAIM

This application claims priority from European patent application No. 02425453.4, filed Jul. 10, 2002, which is incorporated herein by reference.

1. Technical Field

The present invention generally relates to the field of semiconductor memories, particularly, but not exclusively, to non-volatile memories and even more particularly to non-volatile electrically erasable memories.

2. Background of the Invention

An important feature of non-volatile electrically erasable (and programmable) memories is the reliability towards multiple write/erase cycles.

Similar to a write operation, an erase operation is normally carried out in a plurality of steps; each step provides for applying an erase pulse to the memory cells to be erased, and then verifying whether the memory cells have been erased or an additional erase pulse is required.

Normally, in a memory, some memory cells are erased faster than others. While some memory cells require few erase pulses to be fully erased, other memory cells require several erase pulses.

An exception is made for the EEPROMs, which features an erase selectivity, in that the erase operation has a global character, affecting, at the same time, a large number of memory cells. Due to this global character, it commonly happens that due to the presence of hard-to-erase memory cells, those memory cells that are instead erased faster are subjected to more erase pulses than what would be strictly necessary.

This causes an unnecessary stress on the memory cells. In electrically erasable memories having memory cells formed by MOS transistors with a conductive floating gate, the memory cells may enter a depletion condition, which typically needs to be recovered by re-writing the memory cells; the erase time and the power consumption are, thus, increased. The situation is even worse in the case of memories having memory cells formed by MOS transistors with a charge-trapping layer, typically of silicon nitride (such as the transistors exploited for forming dual-bit memory cells). In this case, at each erase pulse a certain amount of charge gets trapped in the nitride layer; this trapped charge, which cannot be removed, induces in the course of the time a saturation condition, wherein the memory cells can be subjected to no more write/erase cycles.

Despite the global character of the erase operation, it would, therefore, be desirable, and this has been an object of an embodiment of the present invention, to avoid, as far as possible, submitting the memory cells to unnecessary erase pulses, or at least to limit the number of unnecessary erase pulses to which the already erased memory cells are submitted due to the presence of hard-to-erase memory cells.

SUMMARY OF THE INVENTION

According to an embodiment of the present invention, this and other objects have been attained by means of a line selector for a matrix of memory elements as set forth in claim 1.

Summarizing, an embodiment of the line selector comprises a plurality of matrix line group selection circuits, each one allowing the selection of a respective group of lines of the matrix according to an address; each matrix line group includes at least one matrix line.

Flag means are associated with each matrix line group, that can be set to declare a pending status of a prescribed operation for the respective line group.

Means are provided for entrusting the flag means with the selection of the respective line group during the execution of the prescribed operation. Alternative to the respective line group selection circuit, the flag means enables, when set, the execution of the prescribed operation on the memory elements of the respective matrix line group.

According to an embodiment of the invention, the line selector selects word lines of the matrix of memory elements, and the prescribed operation is an erase operation.

According to another embodiment of the present invention, there is provided a method of conducting a prescribed operation on a matrix of memory elements as set forth in claim 12.

Briefly stated, the method of this embodiment comprises providing a line selector having a plurality of line group selection circuits, each one allowing the selection of a respective group of matrix lines according to an address; each matrix line group includes at least one matrix line.

Each matrix line group is associated with a respective flag.

At least one flag is selectively set to declare a pending status of a prescribed operation for the respective matrix line group, and, the flags are entrusted with the selection of the respective matrix line group as an alternative to the respective matrix line group selection circuit. The at least one flag that has been set enables the execution of the prescribed operation on the respective word line group.

BRIEF DESCRIPTION OF THE DRAWINGS

The features and advantages of the present invention will become more apparent from the following detailed description of an embodiment thereof, made merely by way of non-limiting example in connection with the annexed drawings, wherein.

DETAILED DESCRIPTION

Figure 1:
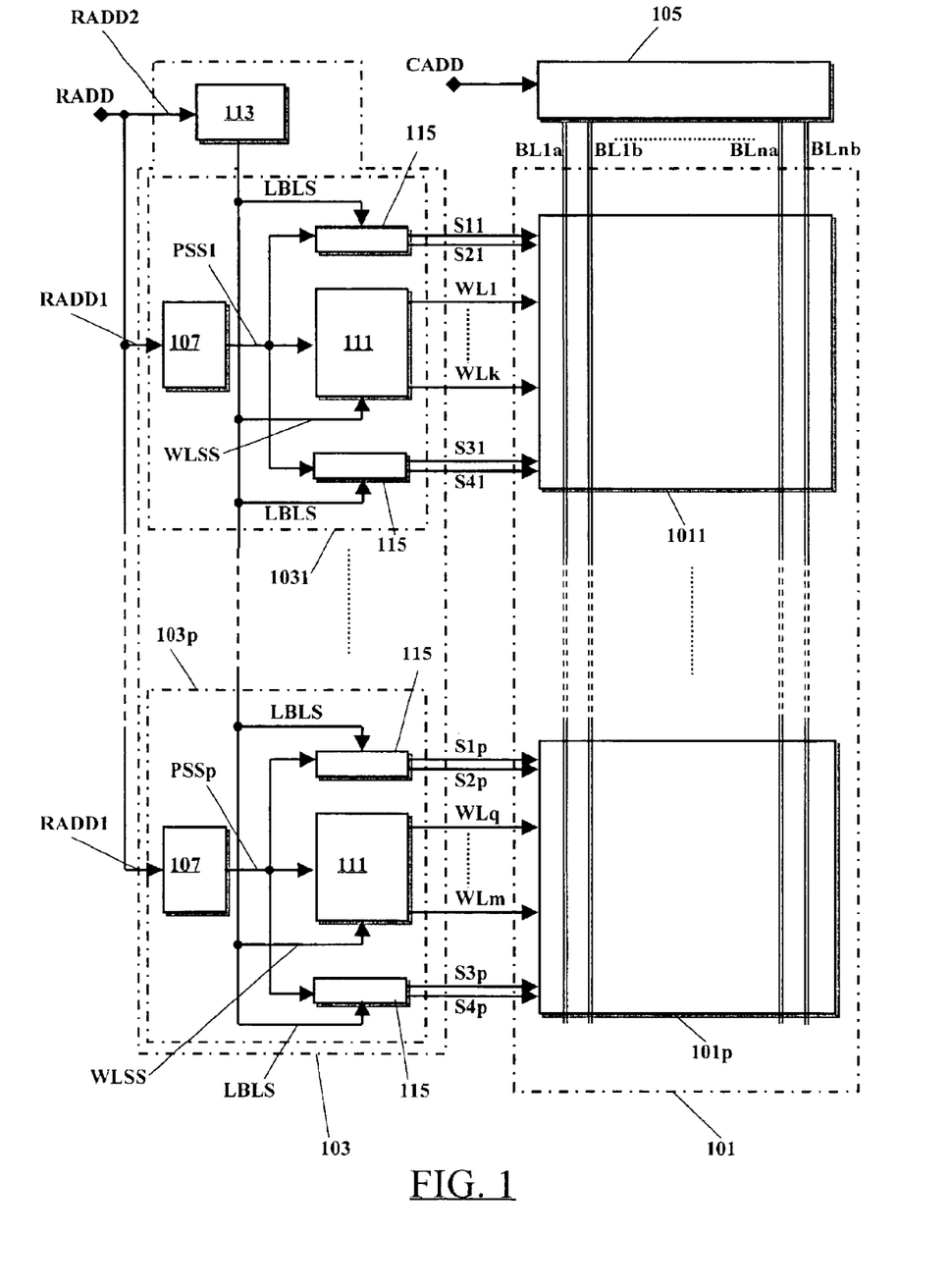
FIG. 1 schematically shows the main blocks of a memory having a word line selector according to an embodiment of the present invention, made up of a plurality of word line selector blocks.

Referring to the drawings, FIG. 1 shows schematically the relevant circuit blocks of an electrically erasable and programmable memory having a word line selector according to an embodiment of the present invention. In particular, and by way of example only, a memory with dual-bit memory cells is considered, i.e., a memory in which the memory cells are capable of storing two bits in two different charge-storage areas of a charge-trapping layer (typically made of silicon nitride). This is, however, not to be intended as a limitation of the present invention, which can be applied to different types of electrically erasable and programmable memories, and particularly to Flash memories having memory cells with a conductive floating gate.

The memory comprises a matrix 101 of memory cells (each memory cell being identified by MC in FIG. 2), arranged by rows and columns.

The memory cells belonging to a same matrix row are connected to a same word line of a plurality of word lines WL1–WLm. The memory cells belonging to a matrix column are connectable to a respective pair of bit lines of a plurality of pairs of bit lines Bl1a, BL1b–Blna, BLnb, by means of a memory cell column selection circuit (not visible in this figure). The bit lines Bl1a, BL1b–Blna, BLnb are common to the whole matrix 101, and will be referred to as main bit lines.

A word line selector 103 and a main bit line selector 105 are provided for selecting the word lines WL1–WLm and, respectively, the main bit lines Bl1a, BL1b–Blna, BLnb, in order to carry on the desired operations (read, program, erase) on the memory cells belonging to the selected word line(s) and main bit line(s). The word line selector 103 and the bit line selector 105 are fed with row address signals RADD and column address signals CADD, respectively; the row address signals RADD and the column address signals CADD carry respective binary codes, identifying one word line WL1–WLk and one pair (or a group of pairs, depending on the degree of parallelism of the memory) of main bit lines Bl1a–BL2B, respectively.

The word line selector 103 comprises a plurality of word line selector blocks 1031–103p, each one associated with a respective group or packet of word lines WL1–WLk, . . . , WLq–WLm. Each word line packet defines a respective portion or sub-matrix 1011–101p of memory cells in the memory cell matrix 101.

Each word line selector block 1031–103p comprises a word line packet selector 107, generating a respective word line packet selection signal PSS1–PSSp. The word line packet selector 107 includes a first-level decoder (not explicitly shown in FIG. 1) fed by a first subset RADD1 of the row address signals.

In each word line selector block 1031–103p, the word line packet selection signal PSS1–PSSp, generated by the respective word line packet selector 107, feeds a word line demultiplexer 111, allowing the selection of individual word lines within the associated word line packet WL1–WLk. The demultiplexer 111 operates a selection of the word lines within the associated word line packet WL1–WLk on the basis of word line selection signals WLSS, generated by a second-level decoder 113 common to all the word line selector blocks 1031–103p and fed by a second subset RADD2 of the row address signals RADD.

In each word line selector block 1031–103p, the word line packet selection signal PSS1–PSSp that feeds the respective word line demultiplexer 111 also feeds a local bit line selection control circuit 115, generating local bit line selection control signals S11–S41, . . . , S1p–S4p that control a local bit line selector (visible in FIG. 2 and identified therein by 201); the local bit line selector 201 allows selecting local bit lines in the respective sub-matrix 1011–101p. The local bit line selection control circuit 115 operates on the basis of local bit lines selection signals LBLS, generated by the second-level decoder 113.

Figure 2:
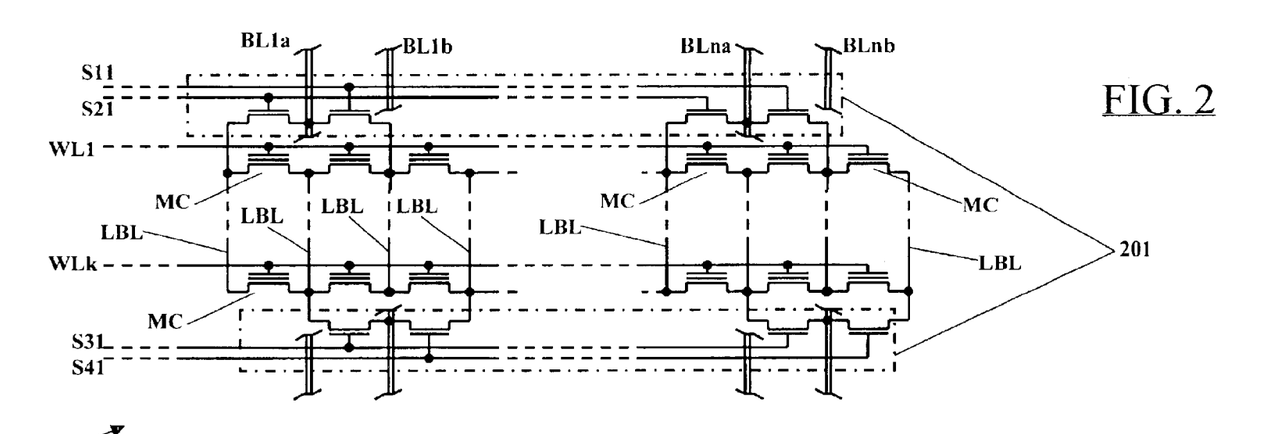
FIG. 2 shows a portion of an array of memory cells of the memory of FIG. 1, namely the portion associated with one word line selector block according to an embodiment of the present invention.

Referring now to FIG. 2, a generic memory cell sub-matrix 1011–101p is shown in detail according to an embodiment of the invention. In this example, the memory cell sub-matrix 1011 is associated with the word line selector block 1031. The memory cells MC belonging to a same matrix row have a control electrode connected to a same word line of the word line packet WL1–WLk. The memory cell sub-matrix 1011 includes a plurality of local bit lines LBL. The memory cells belonging to a same matrix column have a first electrode connected to a first local bit line and a second electrode connected to a second local bit line. The first local bit line is connectable to one main bit line of a respective main bit line pair BL1a, BL1b, . . . , Blna, BLnb, while the second local bit line is connectable to the other main bit line of the main bit line pair. An exception is made for the local bit lines located at the edges of the memory cells sub-matrix, wherein each local bit line is shared by two adjacent columns of memory cells.

Pairs of alternated local bit lines are associated with a same main bit line of a main bit line pair. The local bit line selector 201 allows the selective connecting of each main bit line to either one or the other or none of the two local bit lines associated therewith. The local bit line selector 201 comprises switches, e.g., N-channel MOSFETs, controlled by the local bit line selection control signals S11–S41 generated by the local bit line selection control circuit 115 (FIG.1).

Any main bit line can act as a source line or a drain line for the memory cells, which can, thus, be accessed from mutually opposite directions; this architecture is necessary for dual-bit memory cells, which needs a reversal of source/drain function of the electrodes in the read and program operations.

The local bit lines are formed by diffusions within the semiconductor layer in which the memory cells are formed; the main bit lines are, instead, metal lines.

Figure 3:
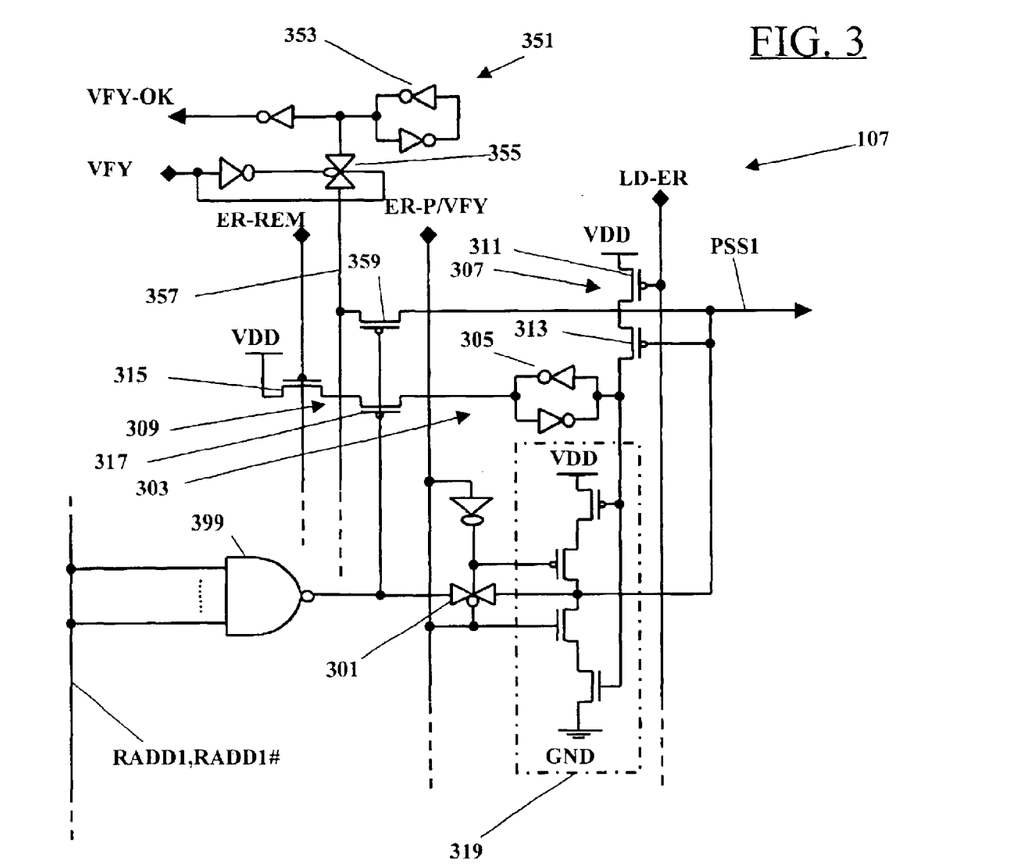
FIG. 3 is a detailed circuit diagram of a word line packet selector of a generic word line selector block, according to an embodiment of the present invention.

Moving now to FIG. 3, a detailed circuit diagram is shown of one of the above-mentioned word line packet selectors 107, e.g., the word line packet selector of the word line selector block 1031, according to an embodiment of the present invention.

The first-level decoder in the word line packet selector 107 is schematically depicted as a NAND logic gate 399, fed by a respective combination of true and complemented versions RADD1, RADD1# of the first subset of the row address signals RADD. Clearly, design considerations suggest that when the number of the row address signals is high, two or more layers of logic gates having few inputs are preferred to a single logic gate having many inputs.

Switch means 301, in the shown embodiment formed by a transfer gate, allow selectively connecting an output of the NAND gate 399 to the packet selection signal line PSS1, i.e., to the inputs of the word line demultiplexer 111 and the local bit line selection control circuit 115. The word line packet selector 107 also includes a set-reset flip-flop 303, comprising a latch circuit 305 formed by two cross-connected CMOS inverters, a flip-flop set circuit path 307, connected to a first terminal (set terminal) of the latch circuit 305, and a flip-flop reset circuit path 309, connected to a second terminal (reset terminal) of the latch circuit 305. The set circuit path 307 comprises two serially-connected, P-channel MOSFETs 311 and 313, connected in series between a supply voltage line VDD and the first terminal of the latch circuit 305. The MOSFET 311 is controlled by a flip-flop set signal LD-ER, common to all the word line selector blocks 1031–103p, while the MOSFET 313 has the gate connected to the packet selection signal line PSS1. The reset circuit path 309 comprises two serially-connected, P-channel MOSFETs 315 and 317, connected between the supply voltage line VDD and the second terminal of the latch circuit 305. The MOSFET 315 is controlled by a flip-flop reset signal ER-REM, common to all the word line selector blocks 1031–103p; the MOSFET 317 has the gate connected to the output of the NAND gate 399. The first terminal of the latch circuit 305 is also coupled to the packet selection signal line PSS1 through a tri-state inverting buffer 319. The transfer gate 301 and the tri-state inverting buffer 319 are activated in a mutually alternative manner by a control signal ER-P/VFY, common to all the word line selector blocks 1031–103p.

The word line selector 103 also includes a status register 351 which, albeit shown in FIG. 3 as associated to the word line packet selector 107, is common to all the word line selector blocks 1031–103p. The status register 351 includes a latch circuit 353, switch means 355 (in the shown example, formed by a transfer gate) controlled by a status register load signal VFY, for selectively connecting a set terminal of the latch circuit 353 to a signal line 357 common to all the word line selector blocks 1031–103p. In each word line packet selector 107 of each word line selector block 1031–103p, switch means 359 (in the shown example, formed by a P-channel MOSFET) controlled by the output of the respective NAND gate 399 (i.e., the first-level decoder) allow selectively connecting the common signal line 357 to the packet selection signal line PSS1. An output signal line VFY-OK of the status register 351 carries the status of the status register 351.

Figure 4:
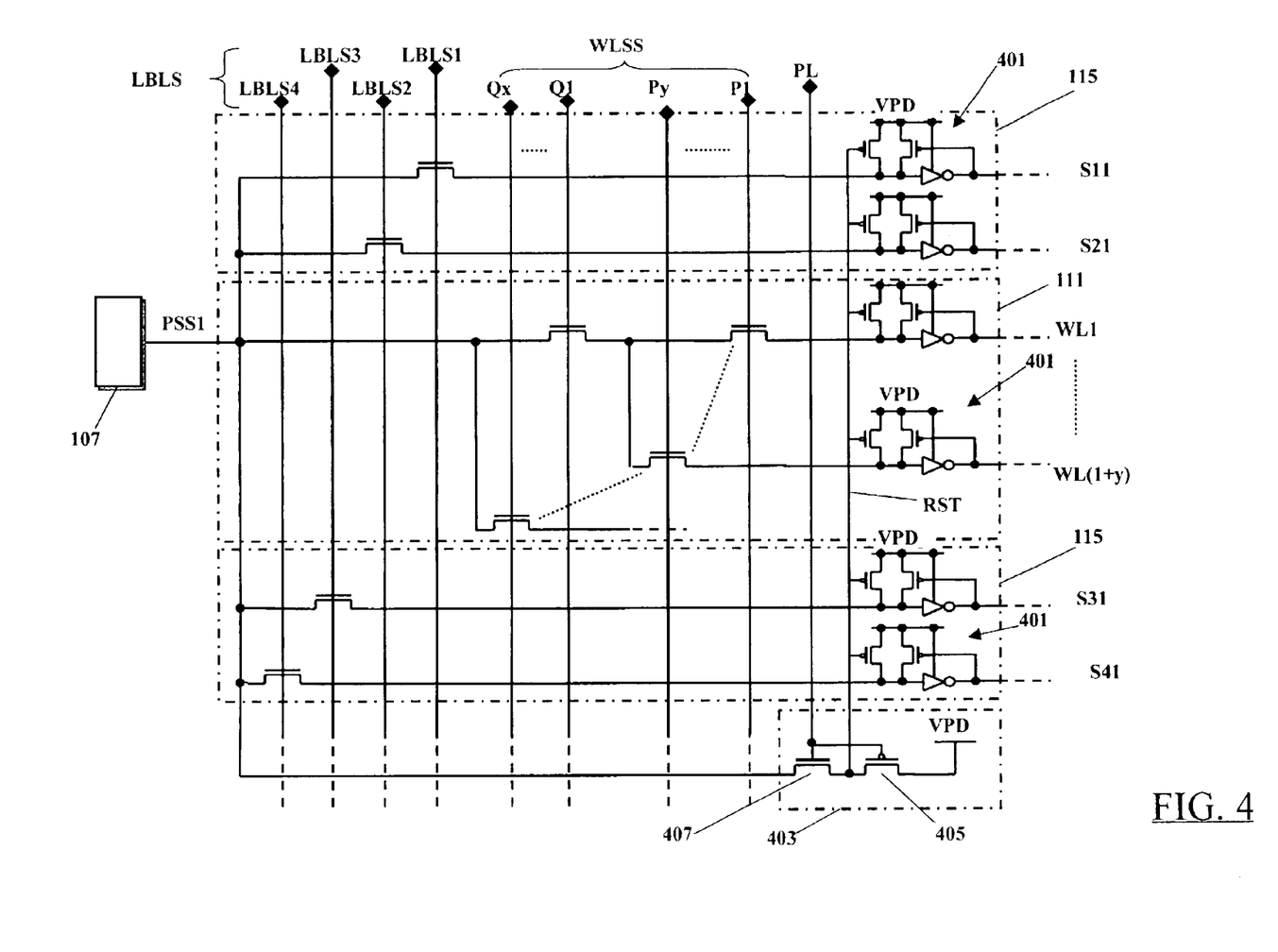
FIG. 4 shows, in detail, a word line demultiplexer and a local bit line selection control circuit of a generic word line selector block according to an embodiment of the invention.

Referring now to FIG. 4, a detailed circuit diagram of a word line demultiplexer 111 and a local bit line selection control circuit 115 of a generic word line selector block 1031–103p is shown, according to an embodiment of the present invention; in particular, the word line selector block 1031 is taken as an example.

In the shown embodiment, the word line demultiplexer 111 is a two-level demultiplexer. A first demultiplexing level allows selecting a sub-packet of word lines among the word line packet, e.g., the word line sub-packet WL1–WL(1+y); a second level of demultiplexing allows selecting one word line out of the selected word line sub-packet. The first and second demultiplexing levels are respectively controlled by first and second demultiplexing level control signals Q1–Qx, P1–Py, forming altogether the word line selection signals WLSS generated by the second-level decoder 113. Design considerations suggest that the number of demultiplexing levels can be higher or lower, depending on the number of word lines. A single demultiplexing level is instead implemented by the local bit line selection control circuit 115, controlled by signals LBLS1–LBLS4, forming altogether the local bit lines selection signals LBLS generated by the second-level decoder 113.

Figure 5:
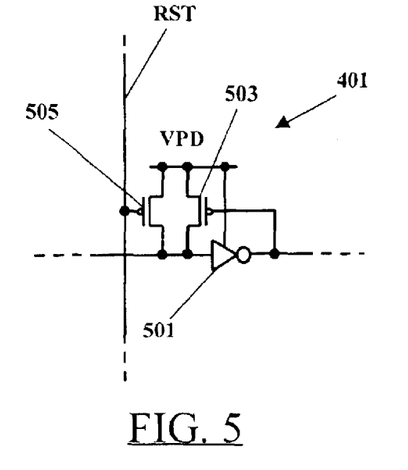
FIG. 5 shows, in detail, a final driver circuit of the word line demultiplexer and the local bit line selection control circuit of FIG. 4 according to an embodiment of the invention.

Final driver circuits 401 are provided at the output of the word line demultiplexer 111 and the local bit line selection control circuit 115, for driving the word lines and the signal lines S11–S41. As shown in FIG. 5, each final driver circuit 401 comprises a CMOS inverter 501, receiving a supply voltage from a supply voltage line VPD switchable between the supply voltage VDD, used during a read operation, and a higher supply voltage, used during a program operation of the memory cells. A feedback-controlled element 503 is provided, in the shown example formed by a P-channel MOSFET connected between the input of the inverter 501 and the supply voltage line VPD, with the gate connected to the output of the inverter 501. A reset element is additionally provided, in the shown example formed by a P-channel MOSFET 505 connected in parallel to the MOSFET 503, and with the gate connected to a signal line RST common to all the final driver circuits 401 of the word line selector block 1031. The signal line RST is controlled by a circuit 403, common to all the final driver circuits of the word line selector block 1031. The circuit 403 comprises a CMOS inverter formed by relatively high resistance MOSFETs 405 and 407, connected between the supply voltage line VPD and the word line packet selection signal line PSS1, and controlled by a control signal PL, which is global and common to all the word line selector blocks 1031–103p.

Figure 6:
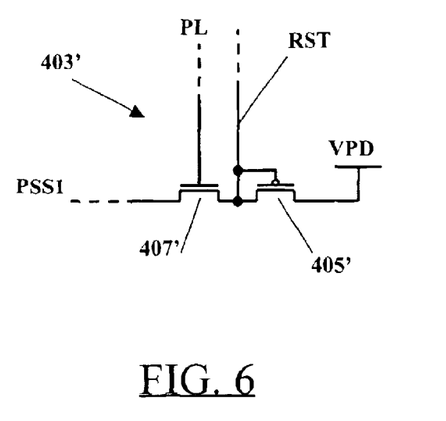
FIG. 6 shows an alternative embodiment of a reset circuit for resetting the final driver circuits of the word line demultiplexer and the local bit line selection control circuit of FIG. 4.

In FIG. 6, an alternative embodiment 403' of the circuit 403 is depicted. In this alternative embodiment 403', two MOSFETs 405' and 407', respectively P- and N-channel, are connected in series between the supply voltage line VPD and the respective word line packet selection signal line PSS1. Instead of being connected in a CMOS inverter configuration, the MOSFET 405' is diode-connected.

Figure 7:
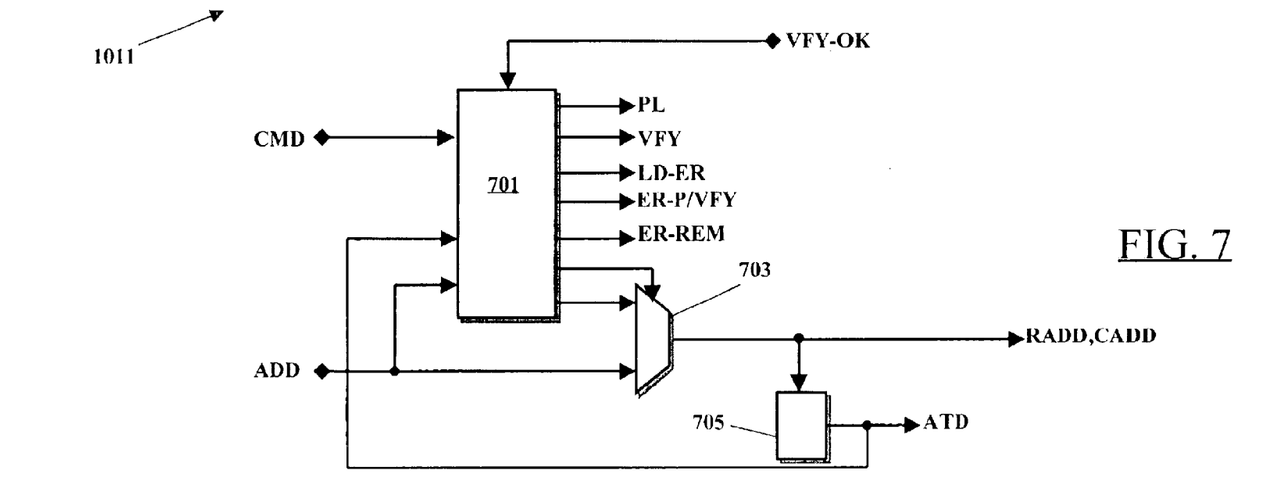
FIG. 7 schematically shows a memory control circuit for controlling the operation of the word line selector according to an embodiment of the invention.

As schematically shown in FIG. 4, a memory control circuit 701, for example, implemented by a state machine, generates the control signals LD-ER, ER-P/VFY, ER-REM, VFY, PL according to a prescribed timing of one embodiment of the invention. The control circuit 701 receives memory commands CMD, supplied to the memory from the outside, for determining the memory operation. Through a multiplexer 703, the row and column address signals RADD and CADD can be selected among address signals ADD fed to the memory from the outside, and address signals generated internal to the memory by the memory control circuit 701; this enables the memory to autonomously perform operations involving the generation of sequences of addresses. The row and column address signals RADD and CADD also supply a conventional address transition detector circuit 703 of the memory, generating an address transition detection pulse ATD whenever a new address is detected; the address transition detection pulse ATD feeds the memory control circuit 701. The control circuit 701 is also fed with the signal VFY-OK carrying the status stored in the status register 351.

The operation of the word line selector will be now explained.

When the memory has to conduct read and program operations on the memory cell array 101, the word line demultiplexer 111 and the local bit line selection control circuit 115 in every word line selector block 1031–103p are fed with the output of the NAND gate 399. To this purpose, the signal ER-P/VFY is kept deasserted (low logic level, corresponding to the reference or ground voltage GND), so that in each word line selector block 1031–103p, the transfer gate 301 connects the output of the NAND gate 399 to the respective signal line PSS1–PSSp; at the same time, the tri-state inverting buffer 319 is put in a high-impedance condition, therefore, the flip-flop 303 is isolated from the signal line PSS1–PSSp.

Depending on the current row address signals RADD, the output of one of the NAND gates 399, and, thus, one of the word line packet selection signals PSS1–PSSp, is asserted (low logic level), one of the signals Q1–Qx is asserted (high logic level), and one of the signals P1–PY is asserted (high logic level), so that one of the word lines WL1–WLm is selected. The potential of the selected word line is brought by the respective final driver circuit 401 to the supply voltage VPD, whose value depends on the operation to be performed (read or write), while the potential of all the remaining word lines is kept to ground.

Figure 8A:
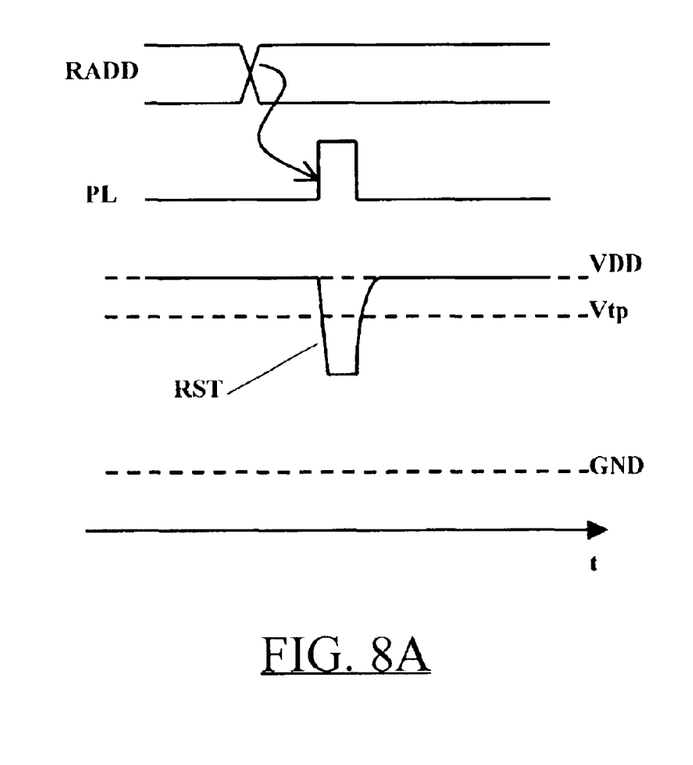
FIGS. 8A and 8B are simplified time diagrams showing the operation of the two alternative embodiments of the reset circuits.

As schematically shown in FIG. 8A, when the address of the memory location to be accessed in read or write is put on the row and column address signal lines RADD and CADD, the new address is detected by the address transition detector circuit 705, which generates an address transition detection pulse ATD. Consequently, the control circuit 701 produces a short logic "1" pulse on the signal line PL, causing the inverter 403 in each word line selector block 103₁–103p to bring the gates (signal line RST) of the reset element (P-channel MOSFETs 505) of the final driver circuits 401 towards the logic state of the respective word line packet selection signal line PSS1–PSSp. In the word line selector block associated with the selected word line packet, the P-channel MOSFETs 505 of all the final driver circuits 401 are, thus, turned on, and all the respective word lines, as well as the signal lines S11–S41, are reset to the ground potential. The duration of the pulse PL shall be sufficient to cause the potential of the line RST to fall below the threshold voltage Vtp of the P-channel MOSFET 505. The relative dimensions of the MOSFETs 405 and 407 and the duration of the pulse PL are for example such that the potential of the line RST falls from the supply voltage VDD to half this value.

It is pointed out that the reset elements 505 are normally off, and are turned on for only a short time for resetting the respective final driver circuits. This means that the reset elements do not absorb static current.

Figure 8B:
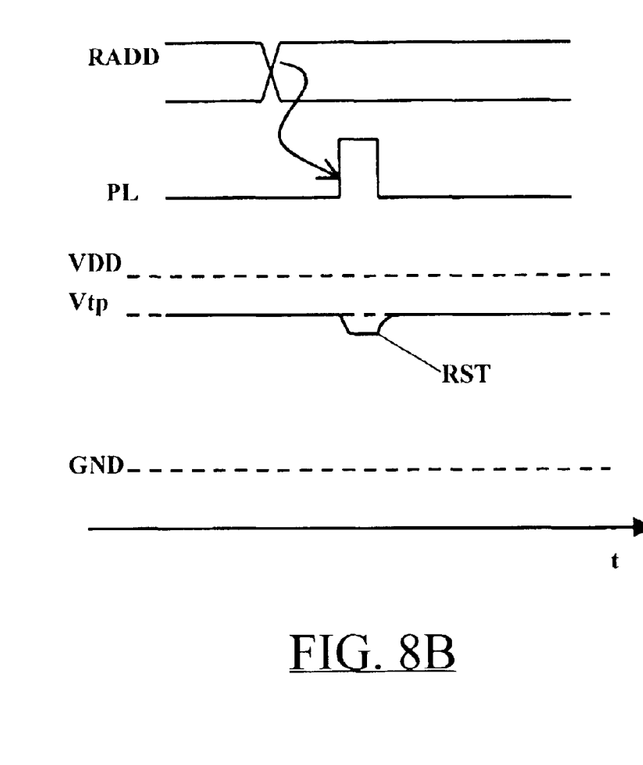

The behavior of the alternative embodiment 403' of the circuit 403 is schematically depicted in FIG. 8B. In this case, the diode-connected P-channel MOSFET 405' normally keeps the potential of the line RST at approximately Vtp, i.e., the threshold voltage of the P-channel MOSFETs 505; these latter are, thus, not fully turned off, as in the previous case, but, however, absorb a very small sub-threshold current. In occasion of the pulse PL, the N-channel MOSFET 407' is turned on, and if the respective word line packet selection signal line PSS1–PSSp is asserted, the potential of the line RST slightly falls from the value Vtp, turning on the P-channel MOSFETs 505.

Compared to the previous embodiment, this alternative embodiment is less sensitive to the value of the supply voltage VDD.

It is pointed out that in both the embodiments, the P-channel MOSFETs 505 that are turned on, and thus absorb current, are only those associated with the final drivers in the word line selector block associated with the selected word line packet.

Let it now be assumed that a given memory cell is to be erased, for example, a memory cell belonging to a word line in the word line packet WL1–WLk, i.e., to the sub-matrix 101₁. Prior to starting the erase operation, the flip-flop 303 in the word line selector block 103₁ associated with such word line packet is set. The signal LD-ER is asserted (low logic level), so that the MOSFET 311 is turned on, enabling the set circuit path 307. In the word line selector block 103₁, associated with the addressed word line packet WL1–WLk containing the memory cell to be erased, the output of the NAND gate 399 is asserted (low logic level). The MOSFET 313 is turned on, and a high logic level is brought to the set terminal of the latch circuit 305 through the set circuit path 307. The flip-flop 303 is, thus, set to a logic "1". In the other word line selector blocks, associated with non-addressed word line packets, the output of the respective NAND gates 399 is deasserted (high logic level); the MOSFETs 313 of the respective set circuit paths are, thus, turned off and the set circuit paths remain disabled, so that the respective flip-flops 303 are not set.

If several memory cells belonging to different word line packets are to be erased, the different word line packets are addressed in sequence (for example, the memory control circuit 701 generates, in sequence, the different addresses), and the flips-flops 303 in the associated word line selector blocks are all set.

After having set the flip-flops 303 in all the word line selector blocks associated with word line packets including memory cells to be erased, the signal ER-P/VFY is asserted (high logic level). The transfer gate 301 is disabled, and the tri-state inverting buffer 319 is enabled. In all the word line selector blocks 103₁–103p, through the tri-state inverting buffer 319, a logic state equal to the logic complement of the logic state latched in the flip-flop 303 is put on the word line packet selection signal lines PSS1–PSSp, i.e., on the inputs of the word line demultiplexer 111 and the local bit line selection control circuit 115. If the state of the flip-flop 303 has been set to a logic "1" in the previous phase, a logic "0" is put on the inputs of the word line demultiplexers 111 and the local bit line selection control circuits 115.

In the matrix architecture herein described by way of example, during the erase operation all the word lines WL1–WLm of the array 101 are biased to ground (all the signals Q1–Qx, P1–PY coming from the second-level decoder 113 are kept at the low logic level); in other words, the low logic level at the input of the word line demultiplexer 111 in the word line selector blocks associated with word line packets to be erased does not affect the word line potentials. The signals LBLS1–LBLS4 are instead all asserted (high logic level), therefore, all the final driver circuits 401 driving the local bit line selection control signal lines S11–S41, . . . , S1p–S4p are connected to the respective signal line PSS1–PSSp. In the word line selector block or blocks associated with word line packets to be erased, the "1" logic state stored in the flip-flop 303 causes the respective signal line PSS1–PSSp to be a logic "0", so that the respective local bit line selection control signals are all brought to a logic "1"; all the local bit lines are, thus, connected to the respective main bit lines. The main bit line selector 105 biases the main bit lines at the potentials required for erasing the memory cells. In the word line selector blocks associated with word line packets that are not to be erased, the "0" logic state stored in the flip-flop 303 causes the input of the respective local bit line selection control circuit 115 to be set to a logic "1", so that all the local bit line selection control signals are kept to ground; the local bit lines are, thus, isolated from the main bit lines.

Clearly, different erase schemes are possible, for example, depending on the matrix architecture and the type of memory cells.

The erase operation is carried out in parallel on all the word line packets selected for erasing, according to the logic state latched in the flip-flop 303 in the associated word line selector blocks.

After a first erase pulse, an erase verify operation is carried out for ascertaining whether the memory cells of the selected word line packets have been erased or not. All the word line packets are sequentially addressed, starting for example from the first one. When a word line packet is addressed, the output of the associated NAND gate 399 is asserted (low logic level); the MOSFET 359 is, thus, turned on, and the signal line 357 is connected to the respective word line packet selection signal PSS1–PSSP. The signal ER-P/VFY is asserted (high logic level), so that the logic complement of the state stored in the flip-flop 303 is put on the signal line PSS1–PSSp. The signal VFY is then asserted (high logic level), so as to enable the loading into the status flip-flop 353 of a state present on the line 357, that is the logic complement of the state stored in the flip-flop 303. Then, before starting the erase verify operation on the memory cells belonging to the addressed word line packet, the logic state of the signal VFY-OK is ascertained; the logic state of the signal VFY-OK coincides with the state stored in the flip-flop 303. If the logic state of the signal VFY-OK is a logic "1", meaning that the word line packet has been submitted to an erase pulse, an erase verify is conducted on the memory cells of the word line packet: all the memory cells of the word line packet are sensed; if instead the logic state of the signal VFY-OK is a logic "0", the erase verify operation on such word line packet is skipped and the next word line packet is addressed.

If the erase verify conducted on the memory cells of the word line packet provides a positive outcome (meaning that all the memory cells have been erased), the flip-flop 303 is reset to a logic "0". To this purpose, the signal ER-REM is asserted (low logic level), so that the reset terminal of the latch circuit 305 is connected to the supply voltage line VDD. In this way, no more erase pulses will be applied to the memory cells of that word line packet. Otherwise, the flip-flop 303 is left set, and one or more additional erase pulses will be applied to the memory cells.

It is to be noted that the word line selector 103 allows a selective erase to be conducted in parallel on the memory cells belonging to one or more word line packets. In case it is desired to perform a global erase on the whole memory cell matrix 101, this can be done by setting one at a time all the flip-flops 303 in all the word line selector blocks 1031–103p; to this purpose, the memory control circuit 701 can force all the true and complemented row address signals RADD1, RADD1# to "1". When the signal LD-ER is asserted, all the flip-flops 303 are, thus, set. Also in this case, additional erase pulses are applied selectively only to the memory cells of the word line packets that, in the erase verify phase, are not yet erased.

It can be appreciated that the word line selector according to the described embodiment of the present invention allows implementing a selective erase of the memory cells in the memory cell matrix 101. In particular, the erase selectivity is by groups or packets of word lines; clearly, the fewer the word lines in each packet, the higher the selectivity.

Thanks to the word line selector according to the described embodiment of the present invention, the erase selectivity is achieved in a rather simple way. Word line selectors having at least a first-level decoder and a second-level decoder are in fact normally provided, therefore, the implementation of the present invention requires minor changes to the conventional word line selector design.

In particular, the word line selector according to the described embodiment of the present invention allows implementing a simple sectorization scheme of the memory: each word line group can in fact be considered as a memory sector, erasable individually and independently from the other sectors.

The word line selector according to the described embodiment of the present invention also allows implementing an efficient erase verify procedure, which on the average reduces the number of unnecessary erase pulses applied to the memory cells. This has a significant impact on the memory aging, and increases the number of write/erase cycles that the memory can sustain.

It is pointed out that the word lines in the word line packets need not be physically consecutive. Scrambling schemes may be implemented for scrambling the correspondence between addresses and word lines.

The embodiments of the invention can be applied to any kind of electrically erasable memory, independently of the architecture of the memory cell matrix (which not necessarily shall provide for main bit lines and local bit lines) and the adopted erasing scheme (which may for example call for biasing the word lines containing memory cells to be erased at a negative potential). Even more generally, the invention can be applied to the selection of lines (rows or columns) of any matrix of memory elements.

The various types of memories which the present invention may be embodied within may be coupled with a processor via a bus as part of a computer system.

The structure of the circuits 403 and 403' for resetting the final drivers 401 is advantageous per-se. They do not introduce static power consumption and, when activated, only a sub-set of the driver circuits is reset, limiting the dynamic power consumption. Incidentally, it is pointed out that any of these two circuits can be used even in a word line selector context in which the flip-flops 303 are not provided, and not only in electrically erasable non-volatile memories, but in general in any kind of semiconductor memory.

Although the present invention has been disclosed and described by way of an embodiment, it is apparent to those skilled in the art that several modifications to the described embodiment, as well as other embodiments of the present invention are possible without departing from the spirit and scope thereof as defined in the appended claims.

In particular, the structure of the flip-flops 303 and 305 may be different, or electrically programmable and erasable memory cells can be exploited.

Also, instead of a single signal line 357 shared by all the word line selector blocks, a plurality of signal lines can be provided, each one associated with one or a group of word line selector blocks.

What is claimed is:

1. A line selector for a matrix of memory elements, comprising a plurality of matrix line group selection circuits, each one allowing the selection of a respective group of matrix lines according to a first address, each matrix line group including a plurality of matrix lines, associated with each matrix line group selection circuit, a respective plurality of matrix line selection circuits, each one for allowing the selection of at least one respective matrix line within the respective matrix line group according to a second address, the matrix line selection circuits comprising matrix line driver circuits for driving potentials of the matrix lines, flag means associated with each matrix line group, that can be set to declare a pending status of a prescribed operation to be conducted globally on the memory elements of the respective matrix line group, the flag means enabling, when set, the execution of the prescribed operation on the respective matrix line group, and means for entrusting the flag means with the selection of the respective line group during the execution of the prescribed operation, in alternative to the respective line group selection circuit.

2. The line selector according to claim 1, in which the matrix lines are word lines.

3. The line selector according to claim 2, in which the prescribed operation is an erase operation of the memory elements.

4. The line selector according to claim 3, in which the flag means are reset after the respective word line group has been erased.

5. The line selector according to claim 4, in which the flag means are reset after the respective word line group has passed an erase verify operation.

6. The line selector according to claim 5, further comprising setting means and reselling means, associated with each flag means for selling and, respectively, reselling the associated flag means, the setting means and resetting means being enabled by the respective line group selection circuit according to the first address.

7. The word line selector according to claim 2, in which the flag means comprises a set-reset flip-flop.

8. The line selector according to claim 2, in which the means for entrusting the flag means with the selection of the respective line group during the execution of the prescribed operation comprise means for disconnecting the line group selection circuit from a respective line group selection signal line, and means for transferring onto the line group selection signal line a state corresponding to that of the respective flag means.

9. The line selector according to claim 2, in which a word line driver reset circuit is associated with each line group selection circuit, activatable for resetting the word line driver circuits of the associated word line selection circuit.

10. The line selector according to claim 9, in which the word line driver reset circuit, when activated, resets the word line driver circuits of the associated word line selection circuit only if the respective group of word lines is selected.

11. A method of conducting a prescribed operation on a matrix of memory elements, comprising:
providing a matrix line selector having a plurality of matrix line group selection circuits, each matrix line group selection circuit allowing the selection of a respective group of matrix lines according to a first address, each matrix line group including a plurality of matrix lines,
providing a plurality of matrix line selection circuits associated with each matrix line group selection circuit, each matrix line selection circuit allowing the selection of at least one respective matrix line within the respective matrix line group according to a second address, the matrix line selection circuits comprising matrix line driver circuits for driving potentials of the matrix lines,
associating with each matrix line group a respective flag,
selectively selling at least one of the flags, to declare a pending status of the prescribed operation to be conducted globally on memory elements of the respective matrix line group, the at least one set flag enabling the execution of the prescribed operation globally on memory elements of the respective matrix line group, and
entrusting the flags with the selection of the respective matrix line group, as an alternative to the respective line group selection circuit.

12. The method according to claim 11, in which the matrix lines are word lines.

13. The method according to claim 12, in which the prescribed operation is an erase operation.

14. The method according to claim 13, in which the setting of the at least one flag comprises selecting the matrix group via the respective line group selection circuit.

15. The method according to claim 14, further comprising applying at least one erase pulse.

16. The method according to claim 15, further comprising verifying an outcome of the at least one erase pulse by accessing the word lines in the word line group associated with the at least one set flag.

17. The method according to claim 16, in which the verifying further comprises resetting the at least one set flag if the outcome of the at least one erase pulse is positive.

18. The method according to claim 17, in which the resetting the at least one set flag further comprises selecting the associated word line group via the respective line group selection circuit.

19. The method according to claim 18, further comprising applying additional erase pulses and verifying the outcome of each additional erase pulse, until the at least one set flag is reset.

20. A memory comprising a matrix of memory elements and a line selector for selecting lines of the matrix, wherein the line selector is realized according to claim 1.

21. A memory, comprising:
rows of memory cells each coupled to a respective word line, the rows arranged in groups of multiple rows;
status circuits each associated with a respective one of the groups of memory rows and each operable to store a flag that allows a predetermined operation to be performed to the memory cells within the respective group;
a selection circuit coupled to the status circuits and operable to load the flag into selected ones of the status circuits without writing data to the memory cells within the memory-row groups respectively associated with the selected status circuits; and
a control circuit coupled to the groups of memory rows and operable to perform the predetermined operation on only memory cells within the groups of memory rows respectively associated with status circuits that are storing the flag.

22. The memory of claim 21 wherein the selection circuit further comprises:
a row address selection circuit operable to select a row of memory cells based upon a first address signal; and
a column address selection circuit operable to select a column of memory cells based upon a second address signal.

23. The memory of claim 21, further comprising a resetting circuit operable to reset the status circuits to a finished state after the operation performed on the memory cells within the associated groups of memory rows has been verified.

24. An electronic system, comprising:
a memory, including,
rows of memory cells arranged in groups each including multiple rows,
status circuits each associated with a respective one of the groups of rows and each operable to store a flag that allows a predetermined operation to be performed to the memory cells within the respective group,
a selection circuit coupled to the status circuits and operable to load the flag into selected ones of the status circuits without writing data to the memory cells within the groups of memory rows respectively associated with the selected status circuits, and a control circuit coupled to the groups of memory rows and operable to perform the predetermined operation on only memory cells within the groups of memory rows respectively associated with status circuits that are storing the flag.

25. The electronic system of claim 24 wherein the memory comprises an electronic erasable and programmable memory.

26. A method, comprising:

loading a first flag into a storage circuit associated with a group of memory rows without writing data to memory cells within the group; and performing a first predetermined operation on only memory cells within groups of memory rows associated with respective storage circuits that are storing the flag.

27. The method of claim 26, further comprising:

loading a second flag into the storage circuit after performing the first predetermined operation on the memory cells within the associated group of memory rows; and performing a second predetermined operation on only the memory cells within the groups of memory rows associated with respective storage circuits that are storing the second flag.

28. The method of claim 26 wherein the first predetermined operation comprises an erase operation.

29. The method of claim 26 wherein the second predetermined operation comprises an erase-verify operation.

* * * * *

UNITED STATES PATENT AND TRADEMARK OFFICE
CERTIFICATE OF CORRECTION

PATENT NO. : 6,930,927 B2  Page 1 of 1
APPLICATION NO. : 10/616414
DATED : August 16, 2005
INVENTOR(S) : Luigi Pascucci It is certified that error appears in the above-identified patent and that said Letters Patent is hereby corrected as shown below:

Column 11,
Lines 17 nd 18, replace "reselling" with -- resetting --.
Lines 18 and 56, replace "selling" with -- setting --.

Signed and Sealed this

Twenty-seventh Day of June, 2006

JON W. DUDAS
*Director of the United States Patent and Trademark Office*